(12) United States Patent
Rapeta et al.

(10) Patent No.: US 11,144,088 B2
(45) Date of Patent: Oct. 12, 2021

(54) CLOCKING SYNCHRONIZATION METHOD AND APPARATUS

(71) Applicant: Intel Corporation, Santa Clara, CA (US)

(72) Inventors: Jagannadha Rao V. V. V. Rapeta, Folsom, CA (US); Mikal Hunsaker, El Dorado Hills, CA (US); Ronald Swartz, Granite Bay, CA (US); Robert Fulton, Rancho Cordova, CA (US); L. Mark Elzinga, Shingle Springs, CA (US); Young Min Park, Folsom, CA (US); David R. Mulvihill, Fort Collins, CO (US)

(73) Assignee: Intel Corporation, Santa Clara, CA (US)

( * ) Notice: Subject to any disclaimer, the term of this patent is extended or adjusted under 35 U.S.C. 154(b) by 119 days.

(21) Appl. No.: 16/430,170

(22) Filed: Jun. 3, 2019

(65) Prior Publication Data
US 2019/0332139 A1  Oct. 31, 2019

(51) Int. Cl.
*G06F 1/12* (2006.01)
*G06F 13/42* (2006.01)

(52) U.S. Cl.
CPC ............ *G06F 1/12* (2013.01); *G06F 13/4282* (2013.01); *G06F 2213/0026* (2013.01)

(58) Field of Classification Search
CPC ..... G06F 1/10; G06F 1/12; G06F 1/14; G06F 13/4282; G06F 2213/0026
USPC .......................................................... 713/400
See application file for complete search history.

(56) References Cited

U.S. PATENT DOCUMENTS

| | | | | |
|---|---|---|---|---|
| 7,999,583 | B2 * | 8/2011 | Rhee | G01R 31/31709 327/156 |
| 10,868,663 | B1 * | 12/2020 | Turker Melek | H03L 7/087 |
| 2013/0329843 | A1 * | 12/2013 | Takeuchi | H04B 1/69 375/375 |
| 2014/0129867 | A1 * | 5/2014 | Caruk | G06F 1/00 713/500 |
| 2016/0336943 | A1 * | 11/2016 | Wei | H03L 7/093 |

* cited by examiner

*Primary Examiner* — Brian T Misiura
(74) *Attorney, Agent, or Firm* — Schwabe, Williamson & Wyatt, P.C.

(57) ABSTRACT

Method and apparatus associated with clocking synchronization are disclosed herein. In various embodiment, a method for communication comprises: entering a clock training period, on successful performance of clock training handshake; entering a start static phase measurement (SSPM) sequence of clock training period, receiving a recovered clock; and processing the recovered clock to determine parts-per-million (PPM) differences, to be subsequently applied to compensate for the PPM differences determined during subsequent clocking synchronization. Linking training is performed after the subsequent clocking synchronization. In various embodiments, clocking synchronization comprises SSC synchronization. Other embodiments are also described and claimed.

22 Claims, 11 Drawing Sheets

CLOCKING SYNCHRONIZATION METHOD AND APPARATUS

TECHNICAL FIELD

The present disclosure relates to the fields of computing and communication. More particularly, the present disclosure relates to clocking synchronization between communication nodes, e.g., between Peripheral Component Interconnect Express (PCIe) host and endpoint communication nodes. In various embodiments, clocking synchronization comprises spread spectrum clocking (SSC) synchronization.

BACKGROUND

The background description provided herein is for purpose of generally presenting the context of the disclosure. Unless otherwise indicated herein, the materials described in this section are not prior art to the claims in this application and are not admitted to be prior art by inclusion in this section.

Many communication standards require SSC on their clocks in order to reduce peak Electro Magnetic Interference (EMI) or Radio Frequency Interference (RFI) to other platform components such as wireless modems, memory or neighboring devices that are prone to this radiation and potentially leads to malfunction. However, with SSC enabled, input/output (I/O) interfaces often call for a common reference clock (Refclk) architecture, in which every communication node gets a copy with a set skew spec. For example, for PCIe, a widely employed serial communication standard, its Refclk is specified at 100 MHz+/−300 Parts-Per-Million (PPM) with 0 to −0.5% SSC spread with modulation range of 30 to 33 KHz to mitigate EMI/RFI. The skew is to be less than 12 ns between host/device. The requirement is difficult to achieve. One solution to compensate this servo phase-locking mechanism with common Refclk is to add elastic buffers, with large buffer depth to mitigate maximum peak-to-peak jitter, and periodically broadcast SKIP Ordered Sets that are ignored by the receiver. However, such solution adds cost in terms of latency, power and die area.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
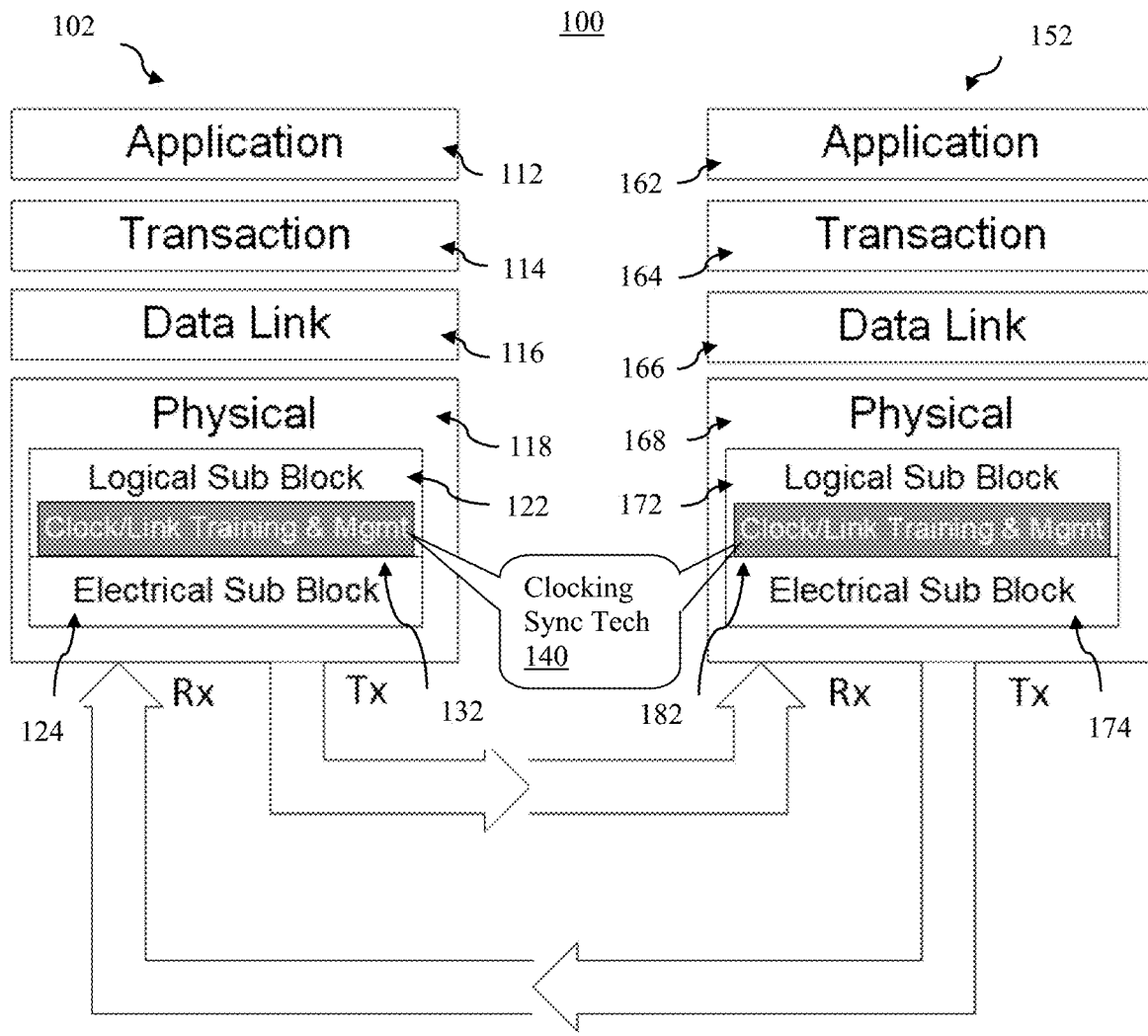
FIG. 1 illustrates an overview of a computing system having two communication nodes incorporated with the clocking synchronization technology of the present disclosure, in accordance with various embodiments.

To address the challenges discussed in the background section, apparatuses and methods associated with clocking synchronization are disclosed herewith In various embodiments, an endpoints/slave communication node synchronizes its clock to the host communication node during clock training, prior to link training. In various embodiments, during clock training, the endpoint/slave communication node synchronizes its clocking to the host communication node, after performing static phase measurement of the recovered clock of the host communication node. During static phase measurement, parts-per-million (PPM) correction for use during subsequent clocking synchronization is determined. During subsequent clocking synchronization, the determined PPM correction is applied. For SSC synchronization, additionally, SSC pattern from the host communication node is continuously monitored, and SSC pattern of the endpoint/slave communication node is adjusted to sync the subsequent generated SSC with the SSC of the host communication node.

In the following detailed description, reference is made to the accompanying drawings, which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C). The description may use the phrases "in an embodiment," or "In some embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Referring now to FIG. 1, wherein an overview of a computing device having communication nodes incorporated with the clocking synchronization technology of the present disclosure, in accordance with various embodiments, is illustrated. As shown, computing system 100 includes communication nodes 102 and 152. In various embodiments, computing system 100 may be a computing platform or a computing device, where communication nodes 102 and 152 are physically coupled to each other, via a communication bus, e.g., communication node 102 being a PCIe host and communication node 152 being a PCIe endpoint, coupled with each other via a PCIe bus. In other embodiments, computing system 100 may be a network of computing devices where communication nodes 102 and 152 are computing devices communicatively coupled with each other over a wired connection, e.g., Ethernet, or a wireless connection, e.g., Zigbee, Bluetooth®, WiFi, or 4G/5G.

Regardless of the embodiments, each of communication nodes 102 and 152 may be viewed as having a plurality of layers, application layer 112/162, transaction layer 114/164, data link layer 116/166, and physical layer 118/168. Application layer 112/162 is an abstraction layer that specifies the shared communications protocols and interface methods used by communication nodes 102 and 152, e.g., PCIe protocols and interface methods or Transmission Control Protocol (TCP) and Internet Protocol (IP) protocols and interface methods. The Transaction layer 114/164 is the starting point in the assembly of outbound transmit (Tx) Transaction Layer Packets (TLPs), and the end point for disassembly of inbound receive (Rx) TLPs. Data link layer 116/166 provides the functional and procedural means to transfer data packets between communication nodes 102 and 152 and might provide the means to detect and possibly correct errors that may occur in physical layer 118/168. Physical layer 118/168 consists of the electronic circuits for transmitting and receiving raw data bits. The bit stream may be grouped into code words or symbols, and converted to a physical signal that is transmitted over a transmission medium, which may be a wire or free space.

In various embodiments, physical layers 118/168 can be further considered as having logical sub-block 122/172 and electrical sub-block 124/174. Logical sub-block 122/172 includes circuitry for performing various logical operations, such as clock/link training and management 132/182, encoding, error correction, and so forth. Electrical sub-block 124/174 includes Tx and Rx circuitry for performing various physical operations such as carrier sensing, collision detection, signal modulation, and so forth. In various embodiments, clock/link training and management 132/182 may be performed at initial bring-up of a host device, at 0 PPM event detection, or at system initiated flow after host bring up, such as online bring-up of a new endpoint or host socket.

In various embodiments, clock/link training and management 132/182 includes the clocking synchronization technology 140 of the present disclosure. During the clock training period, prior to link training, communication node 152 may synchronize its clocking to that of communication node 102. As alluded to earlier, communication node 152 first performs static phase measurement of the recovered clock of communication node 102, including measurement of PPM and determination of PPM correction to be made during subsequent clocking synchronization. Thereafter, communication node 152 synchronizes its clocking to communication node 102. In various embodiments, clocking synchronization comprises SSC synchronization. For these embodiments, communication node 102 provides communication node 152 with SSC pattern, and communication node 152 continuously monitors the SSC pattern of communication node 102, and adjusts its own SSC pattern, applying determined PPM correction, to synchronize its SSC to communication node 102. In other embodiments, PPM correction may also be performed independent of SSC synchronization, e.g., to compensate for different temperature drift.

In a first set of embodiments, to synchronize SSC, communication nodes 102 and 152 use the same reference clock frequency, but the SSC is generated independently within input/output (I/O) clocking PPM specification. For these embodiments, the Rx of communication node 152 detects 0 PPM or slope change events, and generates in response, the SSC sync signal to commence SSC synchronization. The Rx of communication node 152 further generates static offset to compensate for reference clocks PPM misalignment. In a second set of embodiments, to synchronize SSC, a message based approach is employed by communication nodes 102 and 152 instead, with communication node 102 providing 0 PPM event messages to communication node 152. In still a third set of embodiments, the master phase lock loop (PLL) of communication node 102 is charged with the responsibility of sending the SSC sync signal to communication node 152.

These and other aspects of the clocking synchronization technology of the present disclosure will be further described below with references to FIGS. 2-6.

Figure 2:
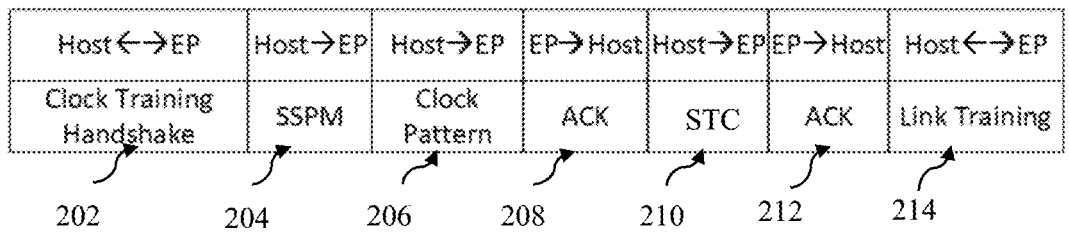
FIG. 2 illustrates an overview of an example clock and link training process, according to various embodiments.

Referring now to FIG. 2, wherein an overview of an example clock and link training process, according to various embodiments, is illustrated. As shown, for the illustrated embodiments, example clock and link training process 200 between a host communication node (or simply, Host), and an endpoint/slave communication node (or simply endpoint or EP), e.g., communication nodes 102 and 152 of FIG. 1, includes operations performed at stages 202-214. In alternate embodiments, process 200 may include more or less operations, or with some of the operations performed in different order.

Process 200 starts at stage 202. At stage 202, Host and EP exchanges clock training handshake. On successful completion of the clock training handshake, process 200 proceeds to stage 204. At stage 204, Host instructs EP to start static phase measurement (SSPM). Next, at stage 206, Host sends to EP clock pattern for clock training. On receipt, in addition to performing clock training, EP further detects for static phase, measures and determines PPM correction for use during subsequent clocking synchronization. At completion of static phase and PPM measurement, and PPM correction determination, at stage 208, EP notifies Host with an acknowledgement (ACK).

Next, at stage 210, Host instructs EP to start clocking synchronization (STC) while continuing with clock training. For SSC synchronization, Host further provides EP with SSC pattern. In response, EP continuously monitors the Host's SSC pattern, adjusts its own SSC patterns, applying PPM correction, and synchronizes its SSC to Host. On completion of clocking synchronization and clock training, at stage 212, EP notifies Host with an acknowledgement (ACK).

Next, at stage 214, Host and EP jointly perform link training.

Figure 3:
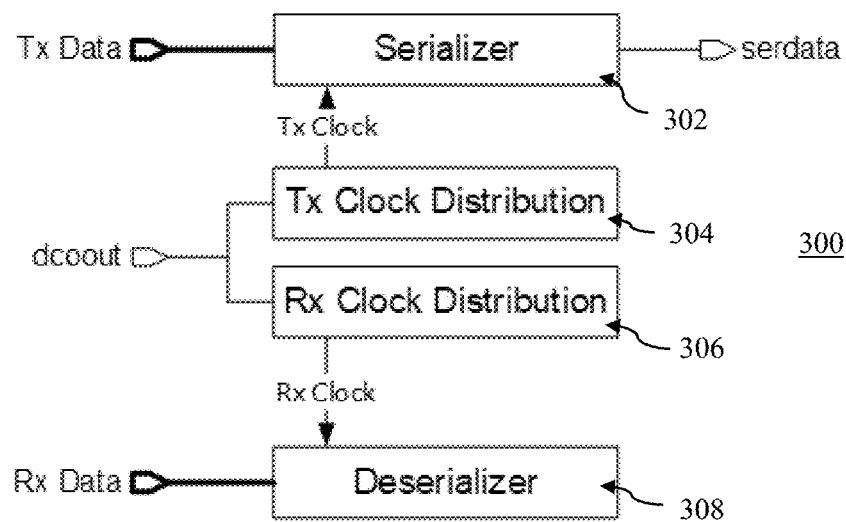
FIG. 3 illustrates an overview of transmit (Tx) and receive (Rx) clock generation and distribution for transmitting data and moving Rx data to local clock domain, according to various embodiments.

Referring now to FIG. 3, wherein an overview of example transmit (Tx) and receive (Rx) clocks generation and distribution for transmitting data and moving Rx data to local clock domain, according to various embodiments, is illustrated. Example Tx and Rx clocks generation and distribution for transmitting data and moving Rx data to local clock domain are illustrated in the context of a set of serial communication embodiments. For the illustrated embodiments, each serial communication node, e.g., a PCIe host or endpoint, which may be communication node 102 or 152 of FIG. 1, includes data serializer 302, data deserializer 308, Tx clock distribution circuitry 304 and Rx clock distribution circuitry, coupled with each other as shown.

In various embodiments, Tx clock distribution circuitry 304 is arranged to generate Tx clock, based on a received digital clock (dcoout). Similarly, Rx clock distribution circuitry 306 is arranged to generate Rx clock, based on the received digital clock (dcoout). Serializer 302 is arranged to serialize the Tx data for transmission (serdata) using Tx clock. Deserializer 302 is arranged to deserialize the received data and output Rx data, using Rx clock.

Figure 4:
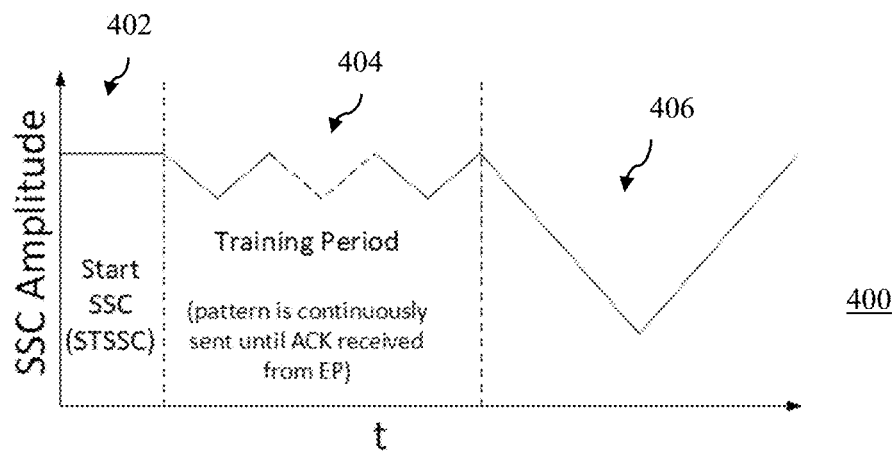
FIG. 4 illustrates recovered clock based SSC synchronization, according to various embodiments.

Referring now to FIG. 4, wherein recovered clock based SSC synchronization, according to various embodiments, is illustrated. As described earlier, an endpoint/slave communication node synchronizing its SSC to a host communication node, recovers the host's clock from the incoming data stream, and performs static phase measurement during clock training, including PPM measurement and correction determination, to be applied during subsequent SSC synchronization. As typical SSC modulating frequency is 30 KHz to 33 KHz, initial lock sync can take ~30 us. To reduce this latency, during an initial clock training interval 402, training pattern, can be sent from the host communication node to the endpoint/slave communication node at higher modulating frequency with reduced SSC amplitude (For example −100 PPM down spread at 1 MHz). The SSC amplitude may be further reduced in later training intervals 404 and 406. Once SSC training with reduced SSC amplitude and higher modulating frequency completed, upon acknowledgement from EP, host can revert back to functional SSC modulating frequency, i.e., 30 KHz to 33 KHz, and amplitude, i.e., 5000 ppm in this example, interval 406.

In various embodiments, an endpoint communication node may start tracking recovered clock from a host communication node, upon receiving STSSC (STart Spread SynC) message during the initial training interval 402. The host communication node may keep sending SSC pattern until receiving the ACK message, as earlier described. In various embodiments, an endpoint communication node may further take into account of flight delay of the ACK message for switching to functional SSC pattern. In other embodiments, where modulation frequency and amplitude are the same as the functional SSC pattern, the endpoint communication node may not need to account for the flight delay of the ACK message before switching to link training.

Figure 5A:
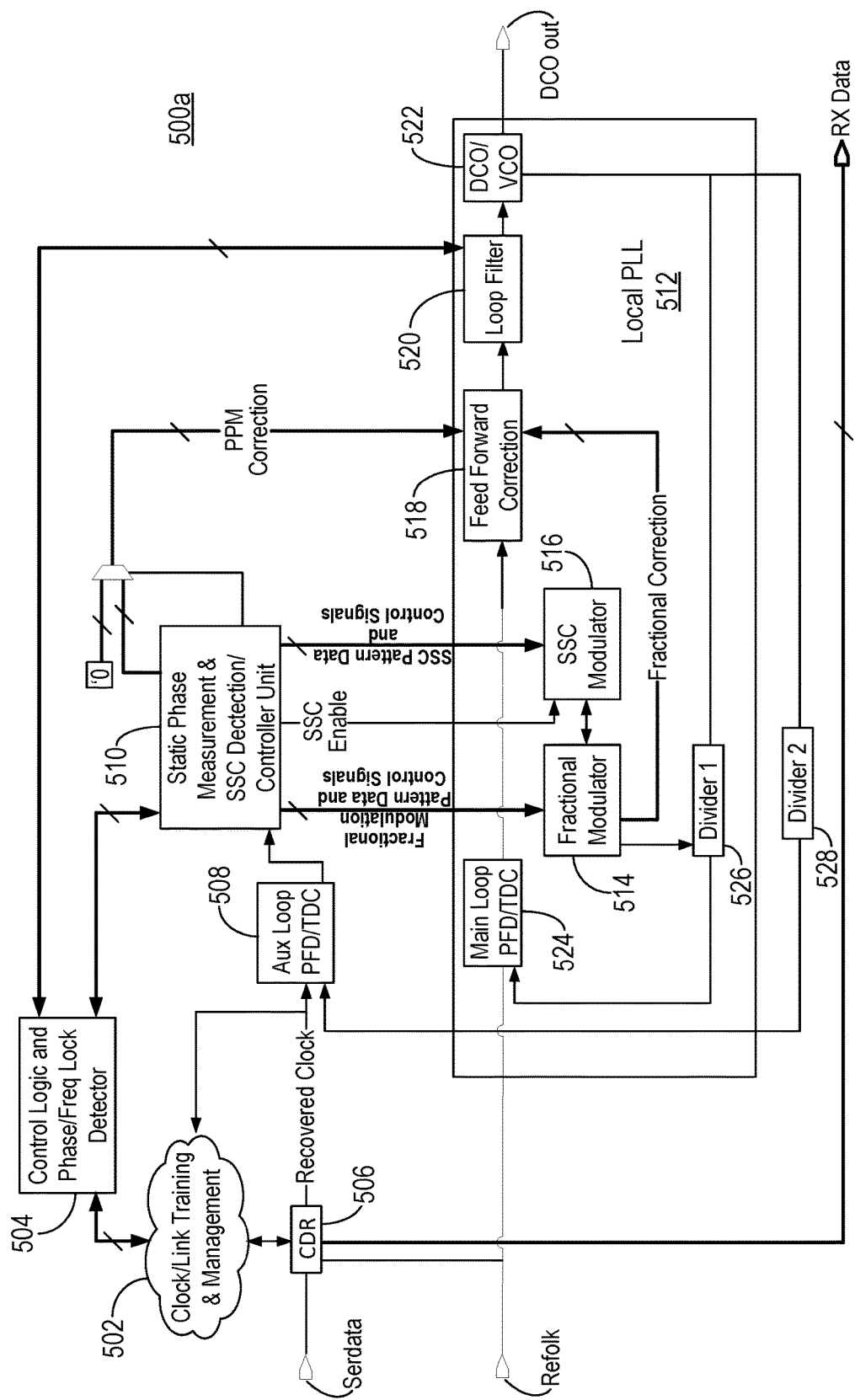
FIGS. 5a-5f illustrate component views of various communication nodes equipped with clocking synchronization technology of the present disclosure, according to various SSC embodiments.
Figure 5B:
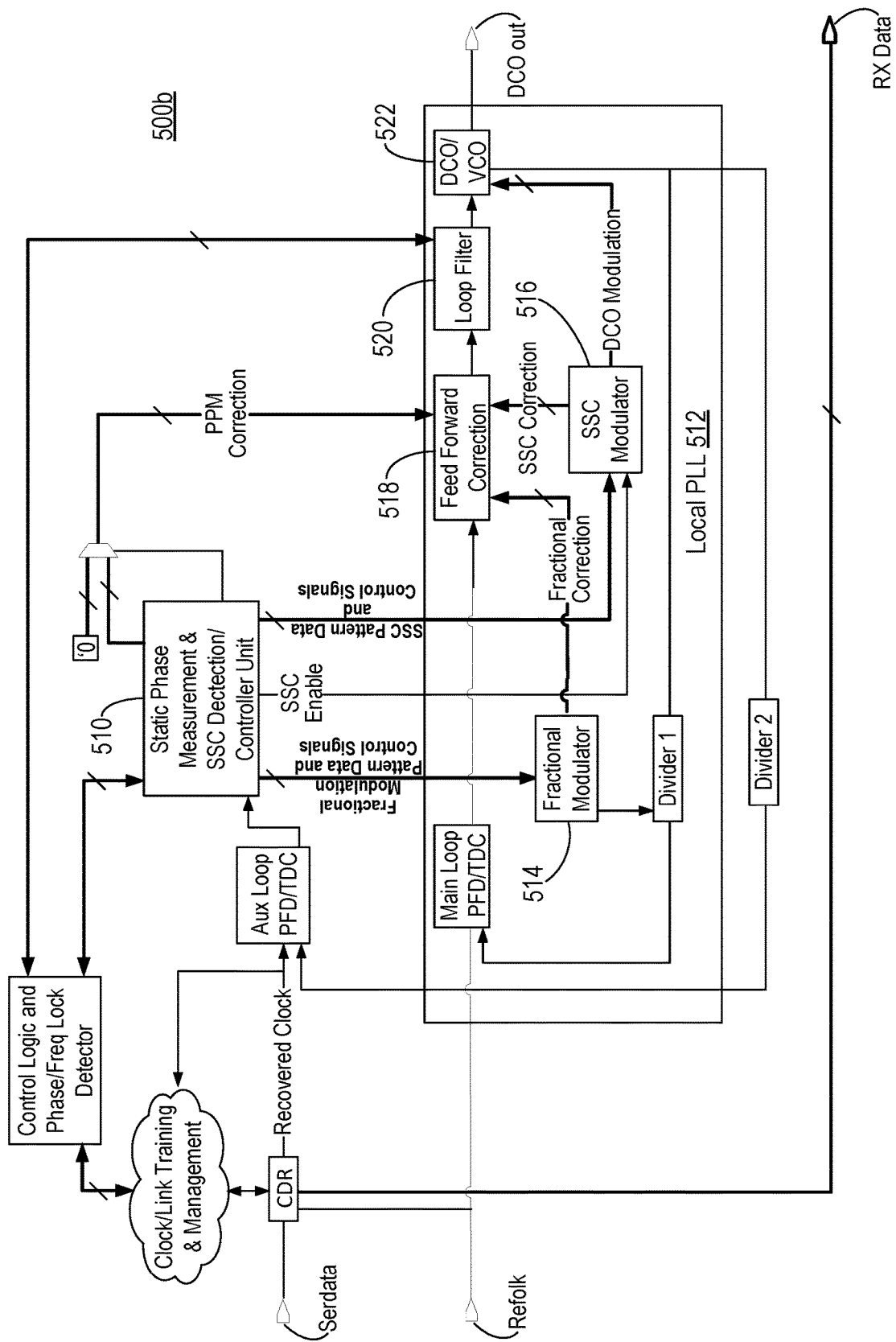
Figure 5C:
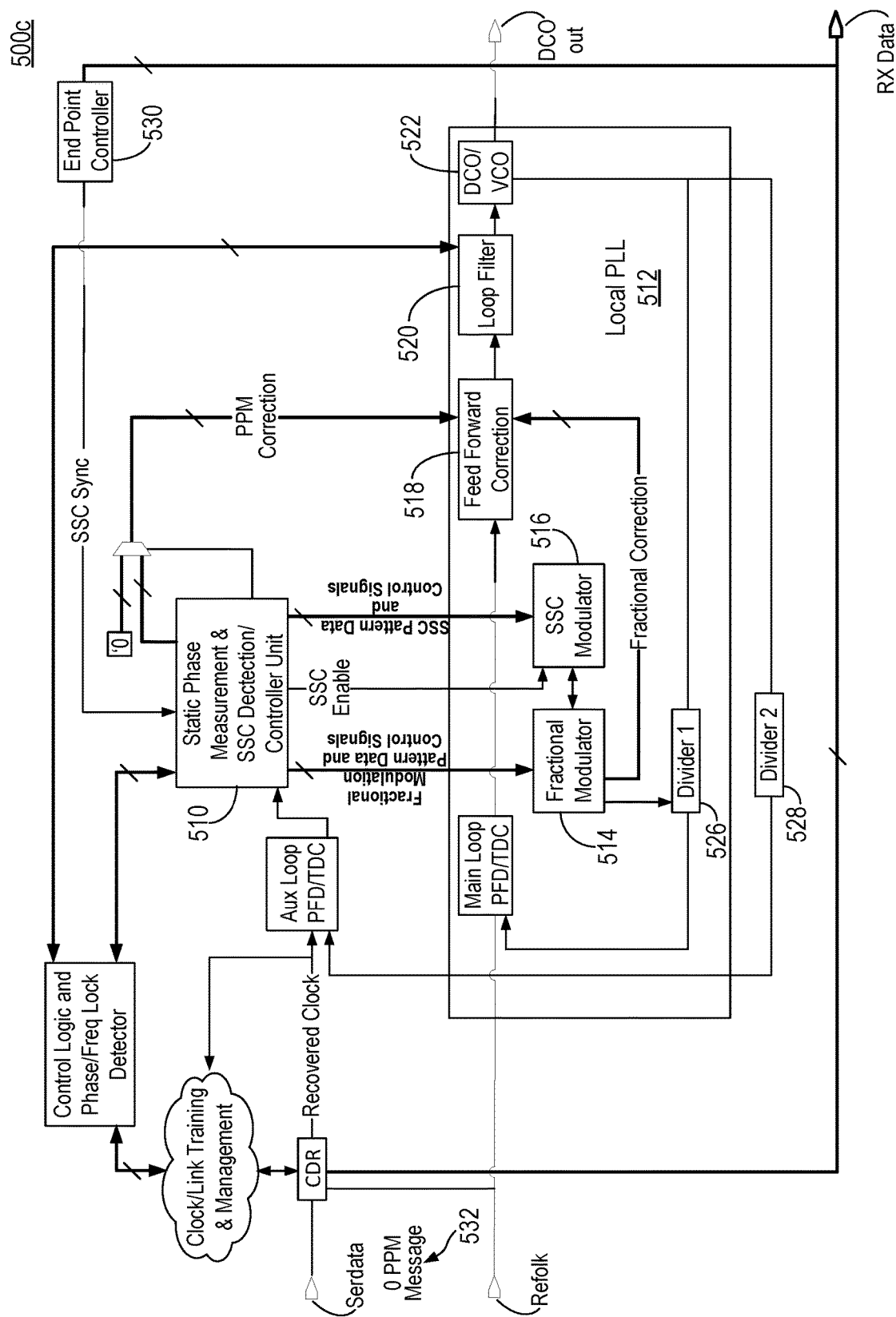
Figure 5D:
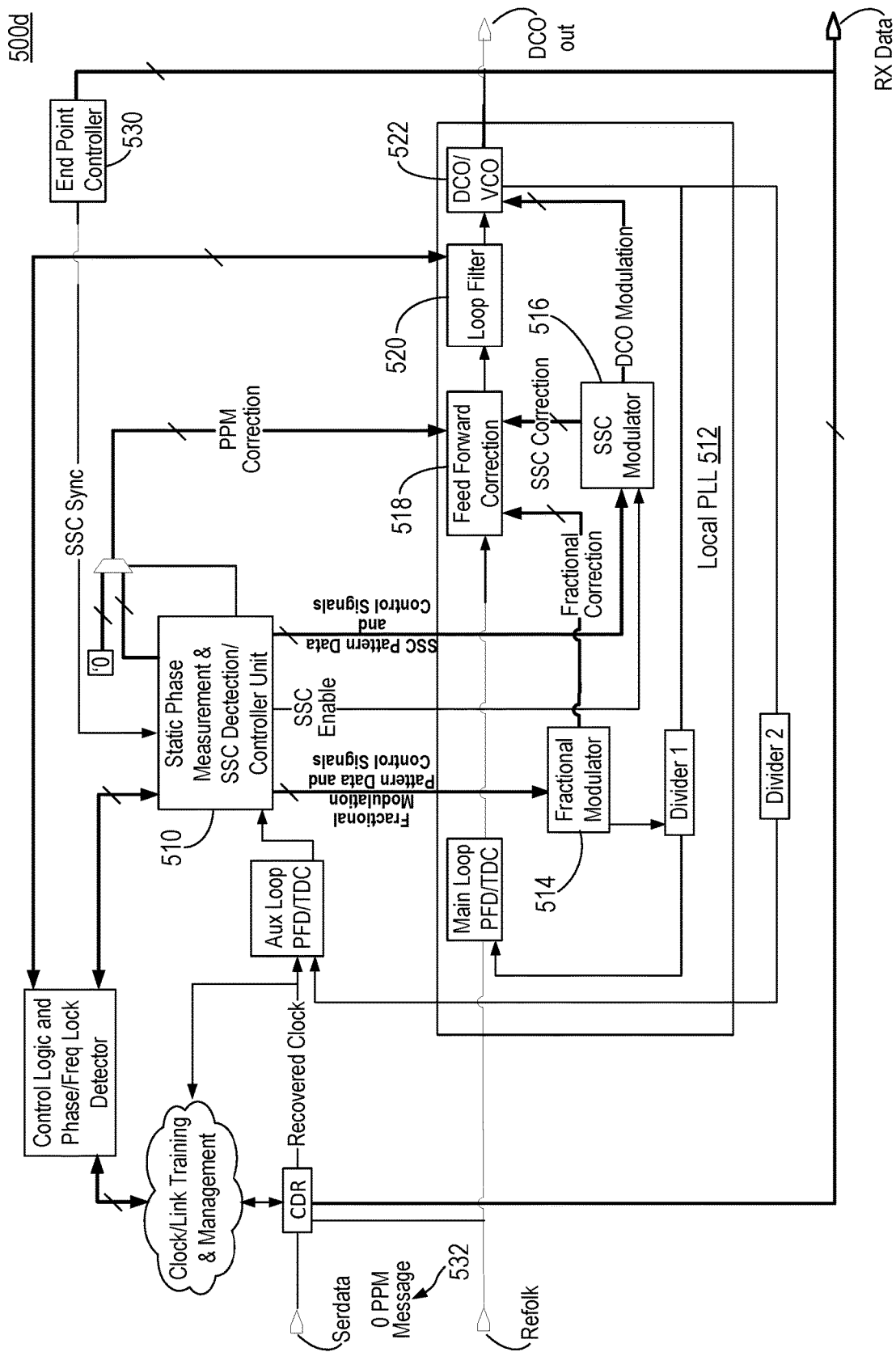
Figure 5E:
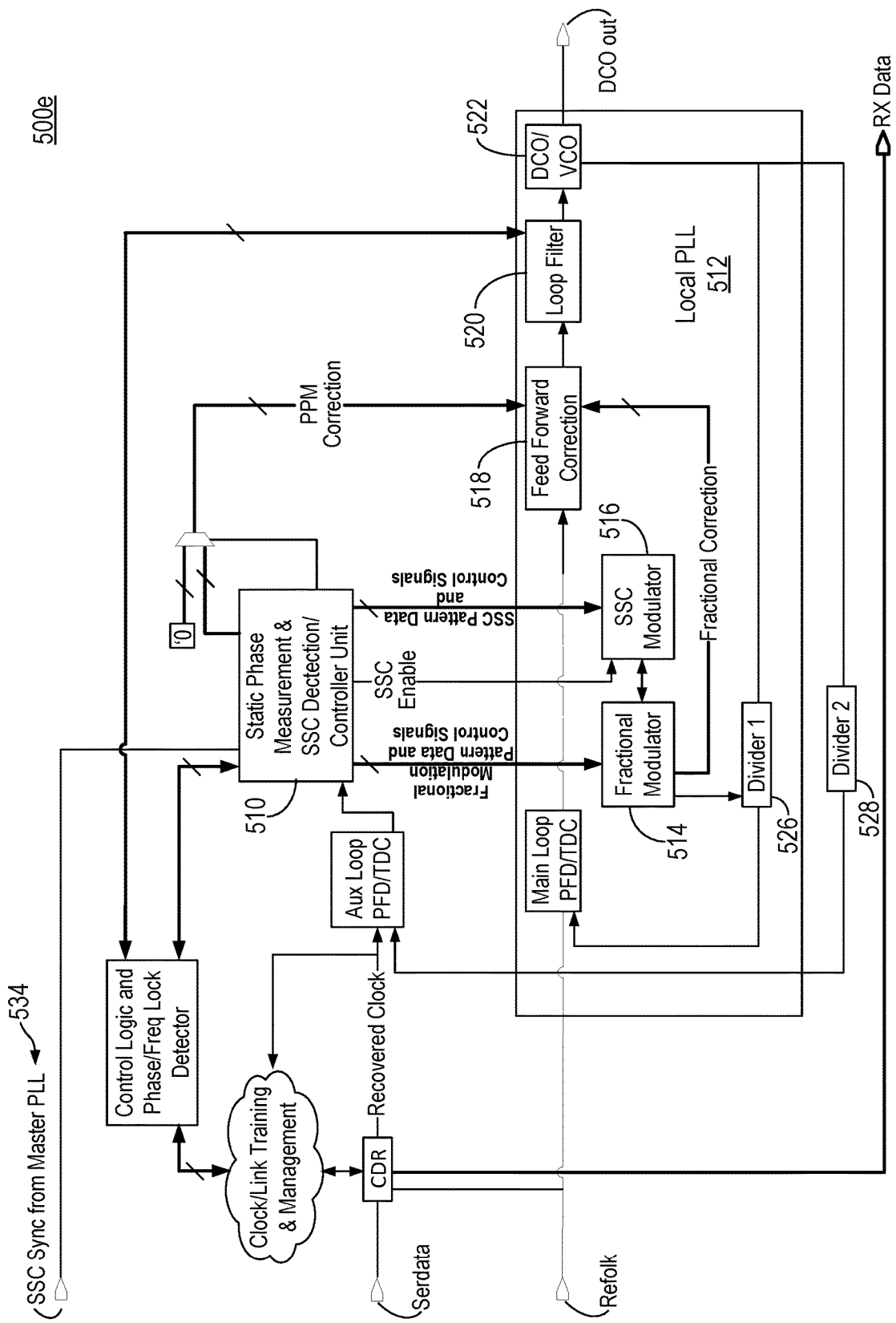
Figure 5F:
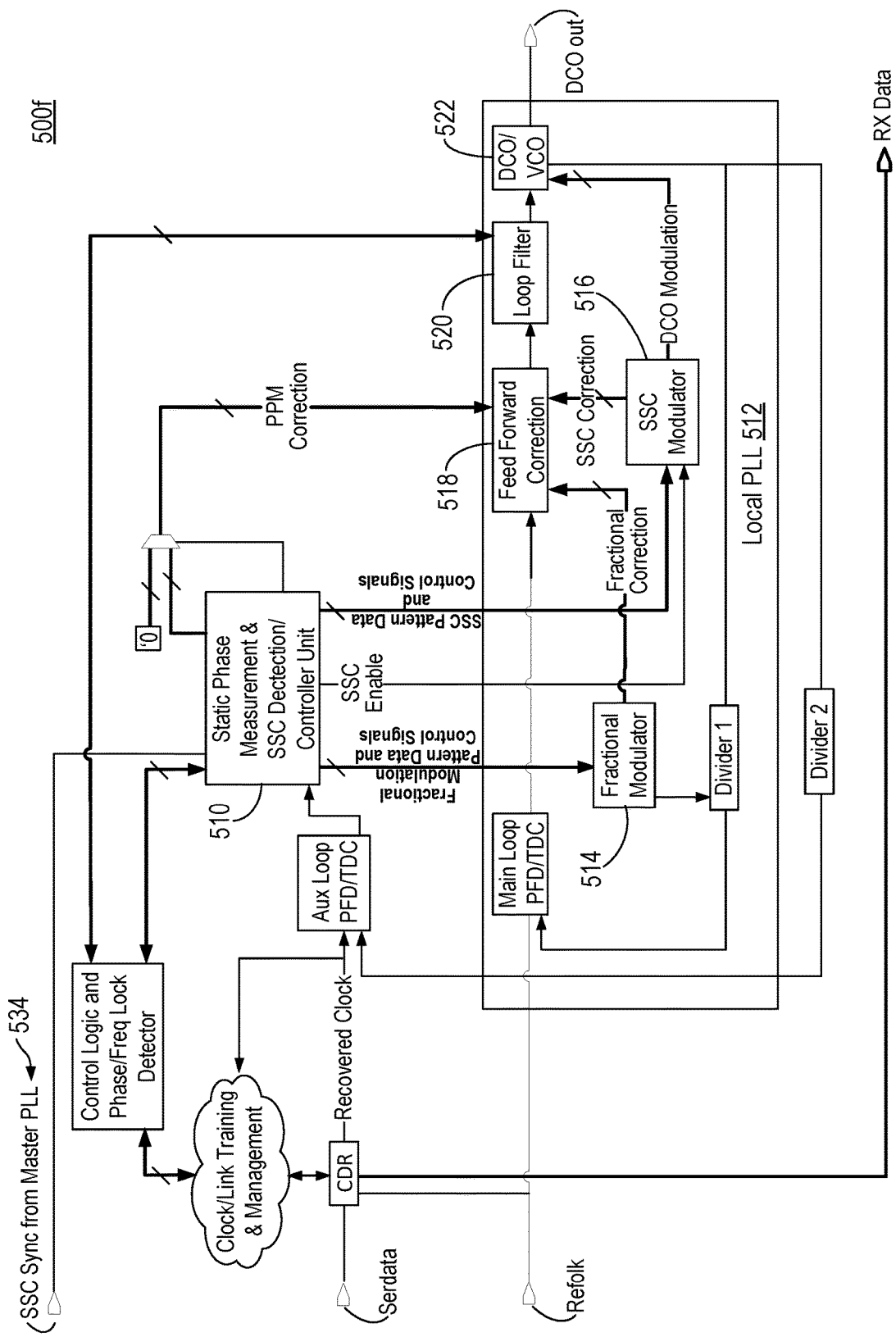

Referring now to FIGS. 5a-5f, wherein component views of various communication nodes equipped with the clocking synchronization technology of the present disclosure, according to various SSC embodiments, are illustrated. FIGS. 5a-5b illustrate the first set of embodiments, where 0 PPM or slop change events in an SSC pattern of the host communication node (on which the SSC sync signal is based) are detected by the endpoint/slave communication node. FIGS. 5c-5d illustrate the second set of embodiments, based at least in part on the provision of 0 PPM event messages (on which the SSC sync signal is based) from the host communication node to the endpoint communication node. FIGS. 5e-5f illustrate the third set of embodiments, based at least in part on the provision of the SSC sync signal from the master PLL of a host communication node to an endpoint communication node. FIGS. 5a-5b will be first described, and then FIGS. 5c-5f will be described in terms of their differences from FIGS. 5a-5b.

As illustrated in FIGS. 5a-5b, a communication node 500a/500b includes clock/link training and management logic 502, control logic and phase/frequency lock detector 504, clock data recovery (CDR) 506, auxiliary loop phase frequency detector/time digital converter (PFD/TDC), static phase measurement (SPM) & SSC detection/controller unit 510, local PLL 512 and divider 528, coupled to each other as shown. In various embodiments, local PLL 512 includes main loop PFD/TDC 524, fractional modulator 514, SSC modulator 516, feed forward correction (FFC) 518, loop filter 520 and digitally controlled oscillator/voltage controlled oscillator (DCO/VCO) 522, coupled to each other as shown.

Clock/link training and management logic 502 is arranged to manage the overall clock/link training process, e.g., the clock/link training process 200. Control logic and phase/frequency lock detector 504 is arranged to detect for phase/frequency lock. CDR 506 is arranged to recover the clock signal from the incoming data stream, e.g., a serial data (serdata) stream. Auxiliary loop PFD/TDC 508 is arranged to detect and output signals indicating the phase difference between the clock recovered from the incoming data stream, and the clock of communication node 500a. SPM & SSC detection/controller unit 510 is arranged to determine the static offset in the recovered clock signal. Local PLL 512 is arranged to apply PPM and fractional corrections to the generation of the SSC, and synchronize the generated SSC with the host communication node. Divider 528 is arranged to divide and provide local PLL's SSC output to auxiliary loop PFD/TDC 508.

In the embodiments of FIG. 5a, main loop PFD/TDC 524 is arranged to receive and forward reference clock (refclk) to FFC 518. Fractional modulator 514 is arranged to receive fractional modulation pattern data and control signal from SPM & SSC detection/controller unit 510 and SSC pattern data from SSC modulator 516, and apply fractional modulation to the fractional modulation pattern data. Fractional modulator 514 outputs the fractionally modulated pattern data to FFC 518 and divider 526. SSC modulator 516 is arranged to receive SSC enable and SSC pattern data and control signals from SPM & SSC detection/controller unit 510, and output SSC pattern data for fractional modulator 514. FFC 518 is arranged to receive Refclk from main loop PFD/TDC 524, PPM corrections from SPM & SSC detection/controller unit 510 and fractional correction from fractional modulator 514, and apply the PPM correction and fractional correction to Refclk. FFC 518 outputs the PPM and fractional corrected phase error to loop filter 520. Loop filter 520 is arranged to filter the phase error, allowing only the desired frequency band to pass through to DCO/VCO 522. DCO/VCO is arranged to receive the pass through component of Refclk, and generates the output digital clock (dcoout), which is also feedback to main loop PFD/TDC 524 via divider 526.

In various embodiments, during clock training period, frequency/phase detection includes determination of static offset of the recovered clock signal. SSC synchronization training is accomplished by sending initial SSC pattern over data lanes. SPM & SSC detection/controller unit 510 detects 0 PPM or slope change events and provides SSC enable to SSC modulator 516 in local PLL 512.

In various embodiments, during clock training, transmitted data can be at lower frequency with integer multiples of intended transmission (e.g., if 10 GHz is the intended operational transmission frequency, the transmission frequency during clock training can be at 1 GHz).

In various embodiments, initially local PLL loop 512 is closed with local reference clock Refclk, and FFC 518 is set to zero. Upon initial lock acquisition based on Refclk, PPM differences between DCO/VCO and the recovered clock is determined using Aux Loop PFD/TDC 508 during Start Static Phase Measurement (SSPM) sequence. Measured static phase is then translated and provided to FFC 518 to compensate for PPM difference. As described earlier, clock pattern is continuously sent by the host communication node until it receives acknowledgement from the endpoint/slave communication node.

Main difference between the embodiments of FIGS. 5a and 5b is, for the embodiments of FIG. 5a, SSC modulation is through feedback divider 526 in local PLL 512, whereas for the embodiments of FIG. 5b, SSC modulation is through direct control of DCO/VCO 522.

FIGS. 5c-5d illustrate a set of alternative message based embodiments. In these embodiments, communication node 500c/500d is similarly constituted as communication node 500a/500b having clock/link training and management logic 502, control logic and phase/frequency lock detector 504, CDR 506, auxiliary loop PFD/TDC, SPM & SSC detection/controller unit 510, local PLL 512 and divider 528, coupled to each other as shown. Further, local PLL 512 includes main loop PFD/TDC 524, fractional modulator 514, SSC modulator 516, FFC 518, loop filter 520 and DCO/VCO 522, coupled to each other as shown. Elements 502-522 are similarly constituted, and arranged to perform the tasks as earlier described for the embodiments of FIGS. 5a-5b.

However, in the message base embodiments of FIGS. 5c-5d, communication node 500c/500d further includes endpoint controller 530, arranged to receive from the host communication node 0 PPM indicator messages (in lieu of detecting for such events by SPM & SSC detection/controller unit 510). In response, endpoint controller 530 generates the SSC sync signal for SPM& SSC detection/controller unit 510, which in turn, generates the SSC enable signal for SSC modulator 516 of local PLL 512 as earlier described.

In these embodiments, training packets can still be similar based on initial clock pattern to remove PPM differences between the host and endpoint communication nodes, if the Refclks are independent. While the additional endpoint controller 530 to receive the 0 PPM event messages is additionally required, the complexity of SPM & SSC detection/controller unit 510 may be reduced, as slope change detection or 0 PPM detection is not needed in SPM & SSC detection/controller unit 510.

Similarly, the main difference between the embodiments of FIGS. 5c and 5d is, for the embodiments of FIG. 5c, SSC modulation is through feedback divider 526 in local PLL 512, whereas for the embodiments of FIG. 5d, SSC modulation is through direct control of DCO/VCO 522.

FIGS. 5e-5f illustrate yet another set of alternate SSC sync signal embodiments. In these embodiments, communication node 500e/500f is similarly constituted as communication nodes 500a/500b and 500c/500d having clock/link training and management logic 502, control logic and phase/frequency lock detector 504, CDR 506, auxiliary loop PFD/TDC, SPM & SSC detection/controller unit 510, local PLL 512 and divider 528, coupled to each other as shown. Further, local PLL 512 includes main loop PFD/TDC 524, fractional modulator 514, SSC modulator 516, FFC 518, loop filter 520 and DCO/VCO, coupled to each other as shown. Elements 502-522 are similarly constituted, and arranged to perform the tasks as earlier described for the embodiments of FIGS. 5a-5b and 5c-5d.

However, in these SSC sync signal base embodiments, SPM & SSC detection/controller unit 510 of communication node 500e/500f is arranged to receive SSC sync signal 534 from the PLL of the host communication node, via a sideband channel between the two communication nodes. SSC Sync signal 534 is generated by the master PLL of host communication node, and transmitted at the SSC frequency rate to endpoint/slave communication node 500e/500f. In various embodiments, the SSC sync signal 534 can be of pulse form whenever SSC enabled or 0 PPM event occurred.

Similar to the embodiments of FIGS. 5c-5d, training packets can still be similar based on initial clock pattern to remove PPM differences between the host and endpoint communication nodes, if the Refclks are independent. These embodiments require the additional sideband interface for the SSC sync signal 534, however, the complexity of SPM & SSC detection/controller unit 510 may be reduced, as slope change detection or 0 PPM detection is not needed in SPM & SSC detection/controller unit 510. Further, as with FIGS. 5a and 5b, or 5c and 5d, the main difference between the embodiments of FIGS. 5e and 5f is, for the embodiments of FIG. 5e, SSC modulation is through feedback divider 526 in local PLL 512, whereas for the embodiments of FIG. 5f, SSC modulation is through direct control of DCO/VCO.

Further, in some embodiments, among all three sets of embodiments, the designated "master" host may have a fail-over mode. For these embodiments, the host containing the master PLL for SSC Sync can fail, and the system can dynamically designate a new device to be the host. Accordingly, the PPM correction logic is further provided with holdover detection logic to maintain current PPM and SSC profile until the new master can be designated by the platform.

Figure 6:
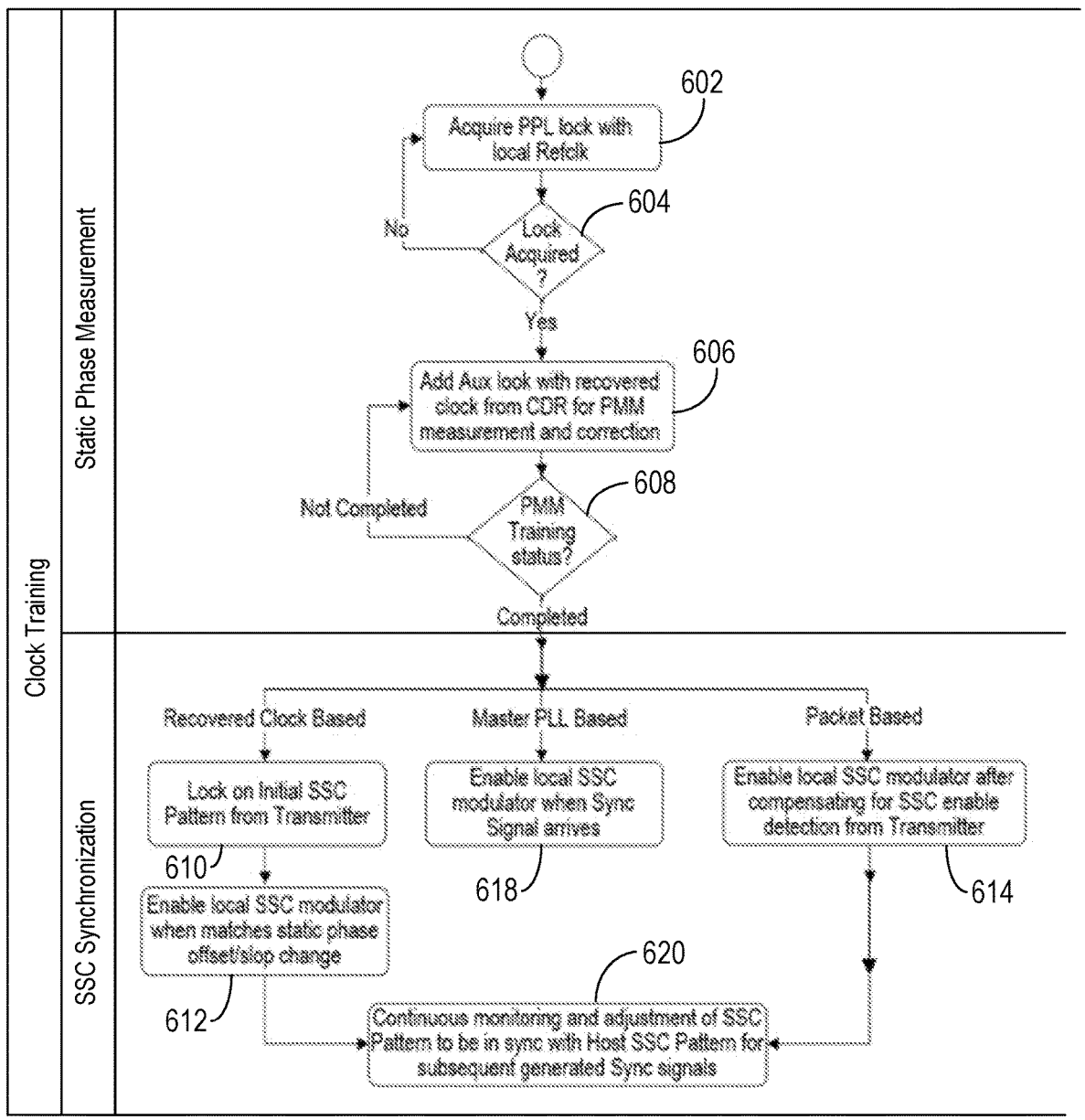
FIG. 6 illustrates an example clocking synchronization process, according to various SSC embodiments.

Referring now to FIG. 6, wherein an example clocking synchronization process, according to various SSC embodiments, is illustrated. As shown, for the illustrated embodiments, SSC synchronization process 600 includes operations performed at blocks 602-620. In various embodiments, the operations may be performed by the corresponding circuit elements of a communication node earlier described with references to FIGS. 5a-5f.

Process 600 starts at block 602. At block 602, attempt is made to acquire the PLL lock by a communication node using a local reference clock, while performing static phase measurement during a clock training period. At block 604, a determination is made on whether the PLL lock is acquired. If a result of the determination at block 604 is negative, process 600 returns to block 602, where attempt to acquire the PLL lock continues. Eventually, when the result of the determination at block 604 is affirmative, process 600 proceeds to block 606.

At block 606, an auxiliary loop with a recovered clock from a CDR of the endpoint communication node is added for PPM measurement and correction. Next, at block 608, a determination is made on the PPM training status. If a result of the determination at block 606 indicates PPM training is not completed, process 600 returns to block 606, where PPM measurement and correction continues. Eventually, when the result of the determination at block 608 indicates PPM training complete, process 600 proceeds to either block 610, 614 or 618 to perform SSC synchronization.

Process 600 proceeds from block 608 to block 610 if SSC synchronization is based on detecting 0 PPM or slope change events in the recovered clock. At block 610, the endpoint communication node locks on to the initial SSC pattern transmitted by the host communication node. Next, at block 612, the endpoint communication node enables local SSC modulation when static phase offset/slop change matches. From block 612, process 600 proceeds to block 620, where the endpoint communication node continuously monitors and makes adjustment so its SSC pattern sync up with the SSC pattern of the host communication node. For these embodiments, continuous monitoring includes continuous detection for 0 PPM or slope event events in the recovered clock.

Process 600 proceeds from block 608 to block 618 if SSC synchronization is based on a SSC sync signal provided by the master PLL of the host communication node. At block 618, the endpoint communication node enables local SSC modulation when the master PLL SSC sync signal arrives. From block 618, process 600 proceeds to block 620, where the communication node continuously monitors and makes adjustment so its SSC pattern sync up with the SSC pattern of the host communication node. For these embodiments, continuous monitoring includes continuous monitoring for the SSC sync signal from the master PLL of the host communication node.

Process 600 proceeds from block 608 to block 614 if SSC synchronization is based on 0 PPM event messages (or packets). At block 614, the endpoint communication node enables local SSC modulation after compensating for SSC enable detection from the transmitter of the counterpart communication node. From block 614 process 600 proceeds to block 620, where the endpoint communication node continuously monitors and makes adjustment so its SSC pattern sync up with the SSC pattern of the host communication node. For these embodiments, continuous monitoring includes continuous monitoring for the 0 PPM event messages (or packets) from the host communication node.

Figure 7:
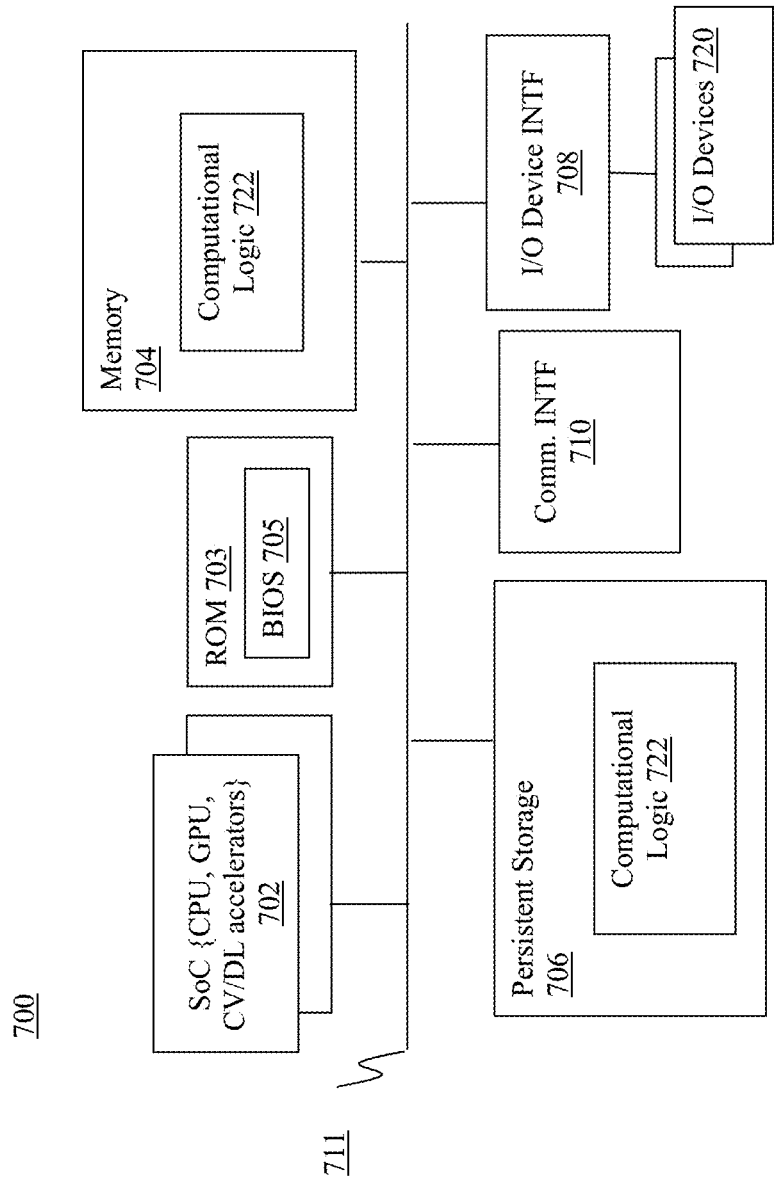
FIG. 7 illustrates a hardware component view of a computer platform suitable for use to practice the present disclosure, according to various embodiments.

Referring now to FIG. 7, wherein an example computing platform that may be suitable for use to practice the present disclosure, according to various embodiments, is illustrated. As shown, computing platform 700 may include one or more system-on-chips (SoCs) 702, ROM 703 and system memory 704. Each SoCs 702 may include one or more processor cores (CPUs), one or more graphics processor units (GPUs), one or more accelerators, such as computer vision (CV) and/or deep learning (DL) accelerators. ROM 703 may include basic input/output system services (BIOS) 705. CPUs, GPUs, and CV/DL accelerators may be any one of a number of these elements known in the art. Similarly, ROM 703 and BIOS 705 may be any one of a number of ROM and BIOS known in the art, and system memory 704 may be any one of a number of volatile storage known in the art.

Additionally, computing platform 700 may include persistent storage devices 706. Example of persistent storage devices 706 may include, but are not limited to, flash drives, hard drives, compact disc read-only memory (CD-ROM) and so forth. Further, computing platform 700 may include one or more input/output (I/O) interfaces 708 to interface with one or more I/O devices 720. Example I/O devices may include, but are not limited to, display, keyboard, cursor control and so forth. Computing platform 700 may also include one or more communication interfaces 710 (such as network interface cards, modems and so forth). Communication devices may include any number of communication devices known in the art. Examples of communication devices may include, but are not limited to, networking interfaces for Bluetooth®, Near Field Communication (NFC), WiFi, Cellular communication (such as LTE 4G/5G) and so forth. The elements may be coupled to each other via system bus 711, which may represent one or more buses. In the case of multiple buses, they may be bridged by one or more bus bridges (not shown).

Each of these elements may perform its conventional functions known in the art. In particular, ROM 703 may include BIOS7405 having a boot loader. System memory 704 and mass storage devices 706 may be employed to store a working copy and a permanent copy of the programming instructions implementing the operations associated with one or more operating systems and/or application, collectively referred to as computational logic 722. The various elements may be implemented by assembler instructions supported by processor core(s) of SoCs 702 or high-level languages, such as, for example, C, that can be compiled into such instructions.

In various embodiments, bus 711 may include one or more PCIe buses. One or more of SoC 702, ROM 703, memory 704, persistent storage 706, communication interface 710, and I/O device interfaces 708 may be a PCIe host or endpoint communication node, incorporated with the clocking synchronization technology of the present disclosure, as earlier described with references to FIGS. 1-6.

Figure 8:
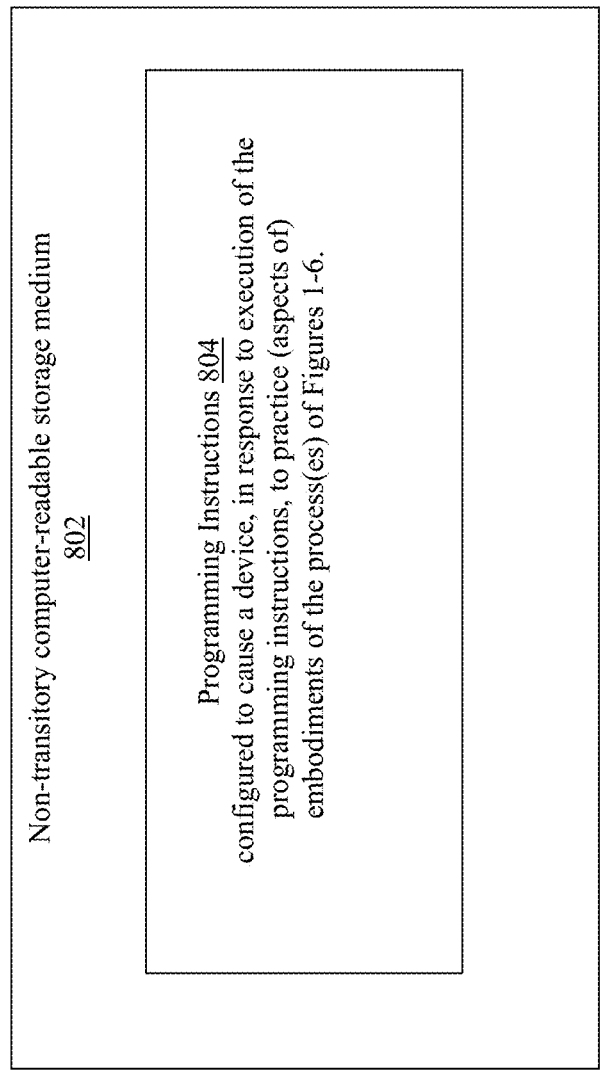
FIG. 8 illustrates a storage medium having instructions for practicing methods described with references to FIGS. 1-6, according to various embodiments.

As will be appreciated by one skilled in the art, the present disclosure may be embodied as methods or computer program products. Accordingly, the present disclosure, in addition to being embodied in hardware as earlier described, may take the form of an entirely software embodiment (including firmware, resident software, micro-code, etc.) or an embodiment combining software and hardware aspects that may all generally be referred to as a "circuit," "module" or "system." Furthermore, the present disclosure may take the form of a computer program product embodied in any tangible or non-transitory medium of expression having computer-usable program code embodied in the medium. FIG. 8 illustrates an example computer-readable non-transitory storage medium that may be suitable for use to store instructions that cause an apparatus, in response to execution of the instructions by the apparatus, to practice selected aspects of the present disclosure. As shown, non-transitory computer-readable storage medium 802 may include a number of programming instructions 804. Programming instructions 804 may be configured to enable a device, e.g., computing platform 700, in response to execution of the programming instructions, to implement (aspects of) one or more operating systems and/or applications. In alternate embodiments, programming instructions 804 may be disposed on multiple computer-readable non-transitory storage media 802 instead. In still other embodiments, programming instructions 804 may be disposed on computer-readable transitory storage media 802, such as, signals.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for purpose of describing particular embodiments only and is not intended to be limiting of the disclosure. As used herein, the singular forms "a," "an" and "the" are intended to include plural forms as well, unless the context clearly indicates otherwise. It will be further understood that the terms "comprises" and/or "comprising," when used in this specification, specific the presence of stated features, integers, steps, operations, elements, and/or components, but do not preclude the presence or addition of one or more other features, integers, steps, operation, elements, components, and/or groups thereof.

Embodiments may be implemented as a computer process, a computing system or as an article of manufacture such as a computer program product of computer readable media. The computer program product may be a computer storage medium readable by a computer system and encoding computer program instructions for executing a computer process.

The corresponding structures, material, acts, and equivalents of all means or steps plus function elements in the claims below are intended to include any structure, material or act for performing the function in combination with other claimed elements are specifically claimed. The description of the present disclosure has been presented for purposes of illustration and description but is not intended to be exhaustive or limited to the disclosure in the form disclosed. Many modifications and variations will be apparent to those of ordinary skill without departing from the scope and spirit of the disclosure. The embodiment was chosen and described in order to best explain the principles of the disclosure and the practical application, and to enable others of ordinary skill in the art to understand the disclosure for embodiments with various modifications as are suited to the particular use contemplated.

Thus various example embodiments of the present disclosure have been described including, but are not limited to:

Example 1 is a communication node, comprising: a phase lock loop (PLL) arranged to generate a clock; a phase frequency detector (PFD) coupled to the PLL to determine parts-per-million (PPM) differences between the PLL and a recovered clock, during a start static phase measurement (SSPM) sequence of a clock training period; and a static phase measurement (SPM) controller coupled to the PLL and the auxiliary loop PFD, and arranged to measure static phase of the recovered clock, receive the PPM differences determined, and provide PPM correction to the PLL to compensate for the PPM differences determined during subsequent clocking synchronization.

Example 2 is example 1, wherein the clocking synchronization comprises spread spectrum clocking (SSC) synchronization; the PLL includes a SSC modulator; and the SPM controller is further arranged to detect a 0 PPM or slope change event in the recovered clock, and in response to a detection of the 0 PPM event, provide a SSC enable signal to the SSC modulator.

Example 3 is example 2, wherein the SPM controller is further arranged to provide SSC pattern data to the SSC modulator; and wherein the SSC modulator generates SSC adjustments, based at least in part on the SSC pattern data.

Example 4 is example 2, wherein the PLL further comprises a digitally controlled oscillator (DCO), and wherein to determine the PPM differences between the recovered clock and the PLL, the auxiliary loop PFD determines the PPM differences between the DCO and the recovered clock.

Example 5 is example 4, wherein the PLL generates the SSC via control of the DCO by the SSC modulator.

Example 6 is example 4, wherein the PLL includes a feedback divider coupled to the DCO; and the PLL generates the SSC using the feedback divider.

Example 7 is example 2 further comprising a local controller to receive 0 PPM event messages from another communication node, and in response to the receipt, generates a SSC sync signal for the SPM controller; wherein the other communication node is a host, and the communication node is an endpoint.

Example 8 is example 2, wherein the SPM controller is further arranged to receive a SSC sync signal from another communication node; wherein the other communication node is a host, and the communication node is an endpoint.

Example 9 is any one of examples 1-8, wherein the PLL is initially closed with a local reference clock (Refclk), and the PLL further comprises a feed forward correction block to receive and apply the PPM correction to compensate for the PPM differences determined.

Example 10 is any one of examples 1-8, wherein the PLL further comprises a fractional modulator; wherein the SPM controller is further arranged to provide factional modulation pattern data to the fractional modulator; and wherein the fractional modulator is arranged to generate fractional correction, based at least in part on factional modulation pattern data.

Example 11 is example 9 or 10, wherein the communication node is a peripheral component interconnect express (PCIe) communication node.

Example 12 is a method for communication, comprising: performing, by an endpoint communication node, clock training handshake with a host communication node; entering, by the endpoint communication node, a clock training period, on successful performance of the clock training handshake; entering, by the endpoint communication node, a start static phase measurement (SSPM) sequence of clock training period, and receiving clocking pattern from the host communication node; and processing, by the endpoint communication node, the clocking pattern to determine parts-per-million (PPM) differences with the host communication node, to be applied to compensate for the PPM differences determined during subsequent clocking synchronization.

Example 13 is example 12, wherein clocking synchronization comprises spread spectrum clocking (SSC) synchronization, and the clocking pattern comprises SSC pattern; wherein the method further comprises: locking, by the endpoint communication node, onto the SSC pattern; enabling, by the endpoint communication node, local SSC modulation when static phase offset or slope change matches; and monitoring, by the endpoint communication node, continuously the SSC pattern, and adjusting its SSC pattern to match the monitored SSC pattern for subsequent generation of SSC signals.

Example 14 is example 12, wherein clocking synchronization comprises spread spectrum clocking (SSC) synchronization, and the clocking pattern comprises SSC pattern; wherein the method further comprises: enabling, by the endpoint communication node, local SSC modulation when a SSC sync signal arrives; and monitoring, by the endpoint communication node, continuously the SSC pattern, and adjusting its SSC pattern to match the monitored SSC pattern for subsequent generation of SSC signals.

Example 15 is example 12, wherein clocking synchronization comprises spread spectrum clocking (SSC) synchronization, and the clocking pattern comprises SSC pattern; wherein the method further comprises: enabling, by the endpoint communication node, local SSC modulation after compensating for SSC enable detection; enabling, by the endpoint communication node, local SSC modulation when static phase offset matches; and monitoring, by the endpoint communication node, continuously the SSC pattern, and adjusting its SSC pattern to match the monitored SSC pattern for subsequent generation of SSC signals.

Example 16 is any one of examples 12-15, wherein the endpoint communication node is a peripheral component interconnect express (PCIe) endpoint communication node.

Example 17 is a communication node, comprising: a physical layer having a logical sub-block, and an electrical sub-block; wherein the logical sub-block includes clock and link training and management logic arranged to: perform clock training handshake with an endpoint communication node; instruct the endpoint communication node to start static phase measurement as part of the clock training, on successful completion of the clock training handshake; provide clock pattern to the endpoint communication node until receipt of an acknowledgement from the endpoint communication node; and instruct the endpoint communication node to start clocking synchronization, on receipt of the acknowledgment.

Example 18 is example 17, wherein clocking synchronization comprises spread spectrum clocking (SSC) synchronization; the clock and link training and management logic is further arranged to provide the endpoint communication node with SSC pattern, on instructing endpoint communication node to start SSC synchronization; wherein the acknowledgement is a first acknowledgment; and wherein the clock and link training and management logic is arranged to provide the endpoint communication node with the SSC pattern, until receipt of a second acknowledgment.

Example 19 is example 18, wherein clock and link training and management logic is further arranged to proceed to cooperate with the endpoint communication node to perform link training on receipt of the second acknowledgment.

Example 20 is any one of examples 17-19, wherein the communication node is a peripheral component interconnect express (PCIe) host communication node.

Example 21 is a communication node, comprising: a physical layer having a logical sub-block, and an electrical sub-block; wherein the logical sub-block includes clock and link training and management logic arranged to: perform clock training handshake with a host communication node; receive instruction from the host communication node to start static phase measurement as part of the clock training, on successful completion of the clock training handshake;

receive clock pattern from the host communication node; provide an acknowledgement to the host communication node on successful completion of the static phase measurement; receive instruction from the host communication node to start clocking synchronization; and start clocking synchronization to the host communication node.

Example 22 is example 21, wherein clocking synchronization comprises spread spectrum clocking (SSC) synchronization; the clock and link training and management logic is further arranged to receive from the endpoint communication node with SSC pattern; wherein the acknowledgement is a first acknowledgment; and wherein the clock and link training and management logic is arranged to provide to the host communication node a second acknowledgment, on completion of SSC synchronization.

Example 23 is example 22, wherein clock and link training and management logic is further arranged to proceed to cooperate with the host communication node to perform link training on provision of the second acknowledgment.

Example 24 is any one of examples 21-23, wherein the communication node is a peripheral component interconnect express (PCIe) endpoint communication node.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A communication node, comprising:
   a phase lock loop (PLL) arranged to generate a clock;
   a phase frequency detector (PFD) coupled to the PLL to determine parts-per-million (PPM) differences between the PLL and a recovered clock, during a start static phase measurement (SSPM) sequence of a clock training period; and
   a static phase measurement (SPM) controller coupled to the PLL and the PFD, and arranged to measure static phase of the recovered clock, receive the PPM differences determined, and provide PPM correction to the PLL, wherein the PLL applies the PPM correction to compensate for the PPM differences determined during subsequent clocking synchronization.

2. The communication node of claim 1, wherein the clocking synchronization comprises spread spectrum clocking (SSC) synchronization; the PLL includes an SSC modulator; and the SPM controller is further arranged to detect a 0 PPM or slope change event in the recovered clock, and in response to a detection of the 0 PPM event, provide an SSC enable signal to the SSC modulator.

3. The communication node of claim 2, wherein the SPM controller is further arranged to provide SSC pattern data to the SSC modulator; and wherein the SSC modulator generates SSC adjustments, based at least in part on the SSC pattern data.

4. The communication node of claim 2, wherein the PLL further comprises a digitally controlled oscillator (DCO), and wherein to determine the PPM differences between the recovered clock and the PLL, the PFD determines the PPM differences between the DCO and the recovered clock.

5. The communication node of claim 4, wherein the PLL generates the SSC via control of the DCO by the SSC modulator.

6. The communication node of claim 4, wherein the PLL includes a feedback divider coupled to the DCO; and the PLL generates the SSC using the feedback divider.

7. The communication node of claim 2, further comprising a local controller to receive 0 PPM event messages from another communication node, and in response to the receipt, generates an SSC sync signal for the SPM controller; wherein the other communication node is a host, and the communication node is an endpoint.

8. The communication node of claim 2, wherein the SPM controller is further arranged to receive an SSC sync signal from another communication node; wherein the other communication node is a host, and the communication node is an endpoint.

9. The communication node of claim 1, wherein the PLL is initially closed with a local reference clock (Refclk), and the PLL further comprises a feed forward correction block to receive and apply the PPM correction to compensate for the PPM differences determined.

10. The communication node of claim 1, wherein the PLL further comprises a fractional modulator; wherein the SPM controller is further arranged to provide factional modulation pattern data to the fractional modulator; and wherein the fractional modulator is arranged to generate fractional correction, based at least in part on factional modulation pattern data.

11. The communication node of claim 1, wherein the communication node is a peripheral component interconnect express (PCIe) communication node.

12. A method for communication, comprising:
   performing, by an endpoint communication node, a clock training handshake with a host communication node;
   entering, by the endpoint communication node, a clock training period, on successful performance of the clock training handshake;
   entering, by the endpoint communication node, a start static phase measurement (SSPM) sequence of clock training period, and receiving a clocking pattern from the host communication node; and
   processing, by a phase frequency detector (PFD) of the endpoint communication node, the clocking pattern to determine parts-per-million (PPM) differences with the host communication node;
   determining, by a static phase measurement (SPM) controller of the endpoint communication node, a PPM correction, and providing the determined PPM correction to a phase lock loop (PLL) of the endpoint communication node; and
   applying, by the PLL, the PPM correction to compensate for the PPM differences determined during subsequent clocking synchronization.

13. The method of claim 12, wherein clocking synchronization comprises spread spectrum clocking (SSC) synchronization, and the clocking pattern comprises SSC pattern; wherein the method further comprises:
   locking, by the endpoint communication node, onto the SSC pattern;
   enabling, by the endpoint communication node, local SSC modulation when static phase offset or slope change matches; and
   monitoring, by the endpoint communication node, continuously the SSC pattern, and adjusting its SSC pattern to match the monitored SSC pattern for subsequent generation of SSC signals.

14. The method of claim 12, wherein clocking synchronization comprises spread spectrum clocking (SSC) synchronization, and the clocking pattern comprises SSC pattern; wherein the method further comprises:
   enabling, by the endpoint communication node, local SSC modulation when an SSC sync signal arrives; and
   monitoring, by the endpoint communication node, continuously the SSC pattern, and adjusting its SSC pattern to match the monitored SSC pattern for subsequent generation of SSC signals.

15. The method of claim 12, wherein clocking synchronization comprises spread spectrum clocking (SSC) synchronization, and the clocking pattern comprises SSC pattern; wherein the method further comprises:
   enabling, by the endpoint communication node, local SSC modulation after compensating for SSC enable detection;
   enabling, by the endpoint communication node, local SSC modulation when static phase offset matches; and
   monitoring, by the endpoint communication node, continuously the SSC pattern, and adjusting its SSC pattern to match the monitored SSC pattern for subsequent generation of SSC signals.

16. The method of claim 12, wherein the endpoint communication node is a peripheral component interconnect express (PCIe) endpoint communication node.

17. A communication node, comprising:
   a physical layer having a logical sub-block, and an electrical sub-block;
   wherein the logical sub-block includes clock and link training and management logic arranged to:
   perform a clock training handshake with an endpoint communication node;
   instruct the endpoint communication node to start static phase measurement as part of the clock training, on successful completion of the clock training handshake;
   provide a clock pattern to the endpoint communication node until receipt of an acknowledgement from the endpoint communication node; and
   instruct the endpoint communication node to start clocking synchronization, on receipt of the acknowledgment;
   wherein clocking synchronization comprises spread spectrum clocking (SSC) synchronization; the clock and link training and management logic is further arranged to provide the endpoint communication node with an SSC pattern, on instructing the endpoint communication node to start SSC synchronization; wherein the acknowledgement is a first acknowledgment, and wherein the clock and link training and management logic is arranged to provide the endpoint communication node with the SSC pattern, until receipt of a second acknowledgment.

18. The communication node of claim 17, wherein the clock and link training and management logic is further arranged to proceed to cooperate with the endpoint communication node to perform link training on receipt of the second acknowledgment.

19. The communication node of claim 17, wherein the communication node is a peripheral component interconnect express (PCIe) host communication node.

20. A communication node, comprising:
   a physical layer having a logical sub-block, and an electrical sub-block;
   wherein the logical sub-block includes clock and link training and management logic arranged to:
   perform a clock training handshake with a host communication node;
   receive instruction from the host communication node to start static phase measurement as part of the clock training, on successful completion of the clock training handshake;
   receive a clock pattern from the host communication node;
   provide an acknowledgement to the host communication node on successful completion of the static phase measurement;
   receive instruction from the host communication node to start clocking synchronization; and
   start clocking synchronization to the host communication node;
   wherein clocking synchronization comprises spread spectrum clocking (SSC) synchronization; the clock and link training and management logic is further arranged to provide an endpoint communication node an SSC pattern; wherein the acknowledgement is a first acknowledgment, and wherein the clock and link training and management logic is arranged to provide to the host communication node a second acknowledgment, on completion of SSC synchronization.

21. The communication node of claim 20, wherein clock and link training and management logic is further arranged to proceed to cooperate with the host communication node to perform link training on provision of the second acknowledgment.

22. The communication node of claim 20, wherein the communication node is a peripheral component interconnect express (PCIe) endpoint communication node.

* * * * *